United States Patent [19]

Wieser

[11] Patent Number: 4,464,588

[45] Date of Patent: Aug. 7, 1984

[54] TEMPERATURE STABLE CMOS VOLTAGE REFERENCE

[75] Inventor: James B. Wieser, Sunnyvale, Calif.

[73] Assignee: National Semiconductor Corporation, Santa Clara, Calif.

[21] Appl. No.: 364,548

[22] Filed: Apr. 1, 1982

[51] Int. Cl.[3] .......................... H03K 3/01; G05F 5/08

[52] U.S. Cl. .................................... 307/297; 307/304; 307/491; 307/496; 323/313

[58] Field of Search ........................ 330/253, 257, 288; 323/313, 315, 316; 307/296, 297, 491, 496

[56] References Cited

U.S. PATENT DOCUMENTS

| | | | |
|---|---|---|---|
| 4,004,164 | 1/1977 | Cranford, Jr. et al. | 323/315 |
| 4,247,824 | 1/1981 | Hilbourne | 330/253 |
| 4,284,958 | 8/1981 | Pryor et al. | 330/288 |
| 4,342,926 | 8/1982 | Whatley | 323/315 |
| 4,346,344 | 8/1982 | Blauschild | 307/304 |
| 4,359,680 | 11/1982 | Hellums et al. | 323/315 |

*Primary Examiner*—Stanley D. Miller
*Assistant Examiner*—B. P. Davis
*Attorney, Agent, or Firm*—Gail W. Woodward; Paul J. Winters; Michael J. Pollock

[57] ABSTRACT

A voltage reference is developed by operating a pair of different threshold CMOS transistors as a differential linear amplifier with the reference voltage value determined as an input offset voltage. The differential amplifier consists of an input stage with controlled offset, a high gain inverter and an output stage which is directly coupled back to the inverting input. The circuit is biased up using a depletion transistor at zero bias and a current mirror configuration for supplying all stages.

8 Claims, 2 Drawing Figures

TEMPERATURE STABLE CMOS VOLTAGE REFERENCE

BACKGROUND OF THE INVENTION

Temperature stable voltage references have been available for a considerable time, particularly in bipolar transistor integrated circuit (IC) form. However, such circuits are not suitable for high density large scale integrated circuit (LSIC) form. In the metal oxide semiconductor (MOS) arts, reference voltages are usually developed by biasing a transistor in their subthreshold region to keep their conduction reasonably low. However, in this mode junction leakage can be a problem. In complementary MOS (CMOS), references have been constructed using the well-known bipolar parasitic transistor structures. These devices represent problems in that they too require substantial areas and their performance is subject to limits imposed by the CMOS devices. They cannot be optimized without upsetting CMOS device properties. .

SUMMARY OF THE INVENTION

It is an object of the invention to provide a CMOS compatible temperature stable voltage reference that does not employ parasitic bipolar devices.

It is a further object of the invention to develop a temperature stable voltage reference in CMOS form using the threshold differential between depletion and enhancement devices operating in their normal saturated regions.

It is a still further object of the invention to bias a depletion transistor and an enhancement transistor into their saturated regions and to develop a reference potential related to their threshold difference and wherein the thus biased pair are connected as part of a linear amplifier.

These and other objects are attained in the following manner to create an on-chip CMOS reference voltage source. A depletion transistor is differentially coupled to an enhancement transistor to form a pair acting as the input stage of a differential amplifier. A current mirror provides a single ended output that drives a high gain inverting amplifier. The inverting amplifier drives a source follower output stage that provides a low impedance source at which the reference potential is available. The reference is directly coupled back to the gate of the enhancement input transistor which is connected to create the amplifier inverting input. The other input state gate constitutes the noninverting input which can be grounded so that the input offset determines the voltage reference. The two input transistors are biased into their saturated regions and are area scaled for equal transconductances. It is desirable that the input stage tail current be determined at that point where the change in input device gate to source voltage as a function of temperature passes through zero at the IC operating temperature.

DESCRIPTION OF THE INVENTION

Figure 1:
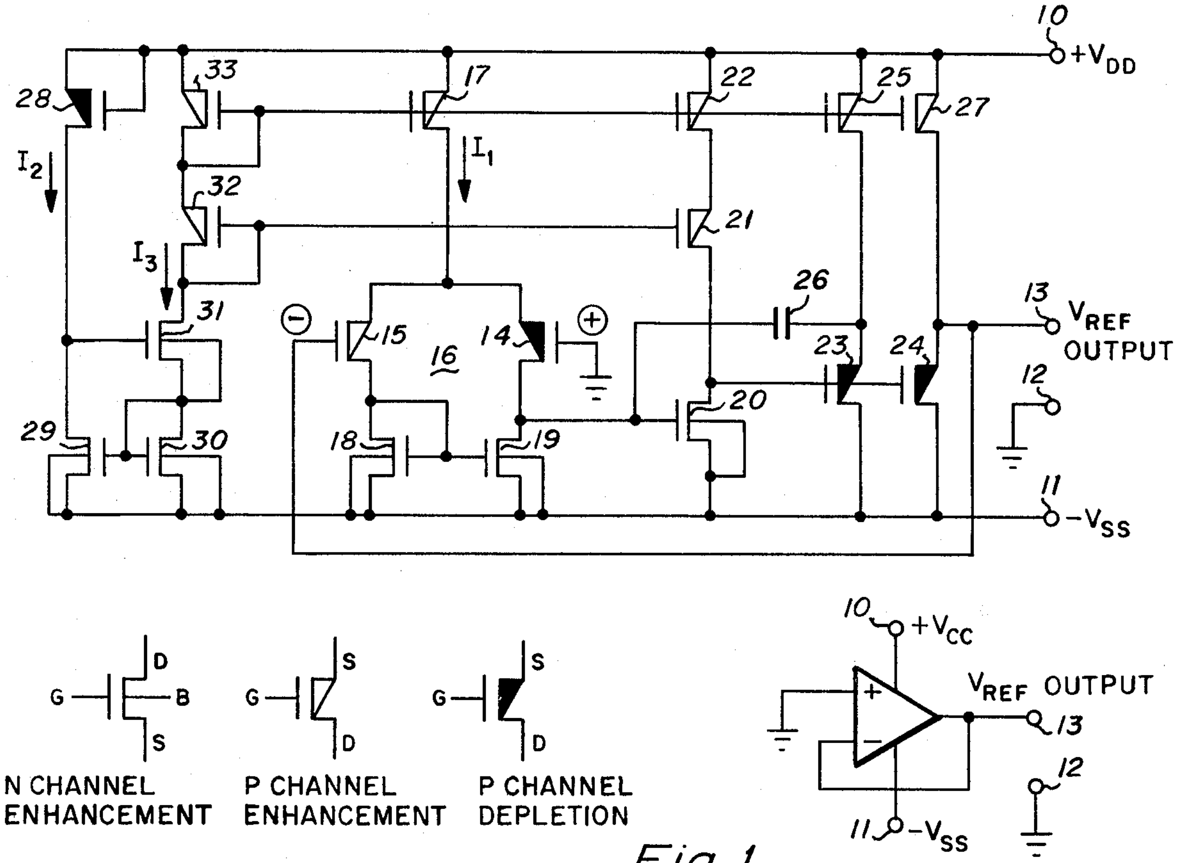
FIG. 1 is a schematic diagram of the circuit of the invention. The inset shows the circuit symbol.

In the schematic diagram of FIG. 1 a power supply is connected to provide $+V_{DD}$ at terminal 10 and $-V_{SS}$ at terminal 11. These supply voltages are referenced to ground terminal 12. Terminal 13 constitutes the output terminal of the circuit.

The circuit shown is adapted for conventional CMOS construction using P-well devices but other CMOS forms could be employed. The heart of the circuit is a depletion transistor 14 differentially coupled to an enhancement transistor 15 to create a differential input stage 16. Transistor 17 provides the tail current, $I_1$, while transistors 18 and 19 form a current mirror load. When transistors 14 and 15 conduct equally, it can be seen that the drain of transistor 19 will be at close to one threshold, $V_{TN}$, above $-V_{SS}$. It is preferred that transistors 14 and 15 are area scaled to provide equal transconductances to minimize any trend towards differences in transconductance that might develop as a function of changes in temperature. Since the depletion device 14 is normally doped to create a zero gate bias channel, it will be made slightly wider than transistor 15 for the same channel length. $I_1$ is selected to provide a tail current for which the variation in gate to source voltage for the input transistors is close to zero for changes in temperature at the operating temperature of the IC.

The drain of transistor 19, which will normally be operating at close to a threshold, $V_{TN}$, above $-V_{SS}$ is directly coupled to the gate of transistor 20 which operates as a very high gain inverter. Its gain is very high because of its cascode connected load which consists of transistors 21 and 22.

The drain of transistor 20 is directly coupled to drive transistors 23 and 24 which both operate as source followers. Transistor 23, which operates with load transistor 25, is optimized as a source follower to drive capacitor 26 which forms a Miller capacitor integrator with inverter 20 to create a conventional frequency compensation feedback circuit. Transistor 24, whih is also directly driven by the drain of transistor 20, serves as a source follower, with its load transistor 27, to provide a low impedance output to terminal 13. The output at terminal 13 is fed back to the amplifier inverting input at the gate of transistor 15. This means that the gate of transistor 14, which comprises the non-inverting input and is grounded, constitutes a unit gain voltage follower. Thus, the output at terminal 13 is referenced to ground and represents the input stage offset voltage. This offset is determined by the difference in threshold voltage between transistors 14 and 15 which is a physical parameter that does not vary appreciably with changes in temperature.

The circuit is biased as follows. $I_2$ is developed as a current in transistor 28 which is a depletion type P-channel structure operated at zero gate to source bias. $I_2$ flows in transistor 29 which operates with transistors 30 and 31 to create a CMOS version of a Wilson current mirror. Thus $I_3$ is related to $I_2$ and both $I_2$ and $I_3$ are substantially independent of the magnitudes of $+V_{DD}$ and $-V_{SS}$.

$I_3$ flowing in transistor 33 determines the current values flowing in mirror transistors 17, 22, 25, and 27. The same $I_3$ flowing in transistor 32 determines the bias level for cascode load transistor 21.

Transistor 24 with its load 27 is optimized for driving a resistive load connected to terminal 13. However, transistor 23 and its load transistor 25 are optimized for driving capacitor 26.

Figure 2:
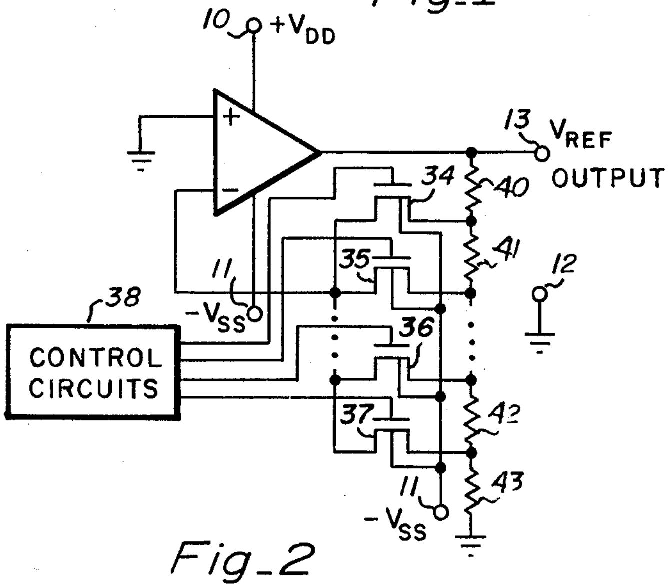
FIG. 2 is a schematic diagram of a circuit useful in trimming the output voltage.

FIG. 2 shows in schematic form how the circuit of FIG. 1 can be made to produce adjustable reference voltages greater than the offset potential. As a practical matter, any reference voltage greater than the offset, consistent with supply voltage, can be produced. Since the gain associated with the circuit of FIG. 1 is very high, an attenuator in the feedback loop can be employed. It is only necessary that the gain exceed the attenuation ratio.

A voltage divider is coupled between output terminal 13 and ground. Resistors 40–43 represent at least a portion of this divider. In the case shown, n divider taps are present. Each tap has connected thereto a transistor as indicated by switches 34–37. A control circuit turns one of the switches 34–37 thereby selecting the desired tap on the divider. The result is that the $V_{REF}$ output is equal to $\alpha$ multiplied by the input offset described above. For the conditions shown in FIG. 2:

$$\alpha = \frac{R_{40} + R_{43} + nR}{R_{43} + (n - x)R}$$

where:

R is the resistance of the designated resistor and elements between $R_{40}$ and $R_{43}$ all have the same value as $R_{41}$ and $R_{42}$ n is the number of divider resistors and x is the tap along n resistors.

Since the circuit of FIG. 1 does not draw any input current, very small digital switch transistors can be employed. For example, N-channel enhancement switches as shown could be employed. When their gates are at $-V_{SS}$ they are off and when their gates are at $+V_{DD}$ they are on. Control circuit 38 could be implemented as a fuse operated matrix or with a microprocessor. It can be seen that 5 fuses could be employed to access 32 different taps on the attenuator. Thus it is a simple matter to incorporate digital control in control circuit 38.

EXAMPLE

The circuit of FIG. 1 was implemented in conventional P-well CMOS. The following device sizes were employed. The W/L ratios are expressed in microns. Capacitor 26 was 5.5 picofarads.

| Device | W/L | Device | W/L | Device | W/L | Device | W/L |
|---|---|---|---|---|---|---|---|
| 14 | 212/14 | 21 | 120/14 | 27 | 60/14 | 32 | 60/14 |
| 15 | 172/14 | 22 | 120/14 | 28 | 170/60 | 33 | 60/14 |
| 17 | 120/14 | 23 | 150/6 | 29 | 134/10 | | |
| 18, 19 | 136/10 | 24 | 1200/6 | 30 | 134/10 | | |
| 20 | 272/10 | 25 | 120/14 | 31 | 134/10 | | |

The $V_{REF}$ value was about $-2$ volts using a $\pm 5$ volt (10 volts overall) supply. This output was substantially independent of supply voltage and output loading conditions. However, it was subject to process variations, particularly the threshold adjusting implants. The above-mentioned output was substantially independent of temperature, having a typical drift value of about 35 ppm/°C. This value did not change appreciably with level shifting trimming as shown in FIG. 2.

The invention has been described and a working example detailed. When a person skilled in the art reads the foregoing, it will become apparent that there are equivalents and alternatives within the spirit and intent of the invention. For example, a positive output polarity reference can be created by grounding the gate of transistor 15 coupling the source of transistor 24 to the gate of transistor 14, and reversing the sense connections to current mirror transistors 18 and 19. Accordingly, it is intended that the scope of the invention be limited only by the claims that follow.

I claim:

1. A CMOS circuit for developing a reference potential having a value substantially independent of temperature, said circuit comprising:

a first transistor of depletion construction;

a second transistor of enhancement construction;

means for operating said first and second transistors as the differential input stage of an operational amplifier, said input stage being operated from a source of tail current;

means for biasing said first and second transistors from the output of said operational amplifier for equal conduction; and means for sensing the offset in said input stage produced by said means for biasing whereby said offset provides said reference potential.

2. The circuit of claim 1 wherein said first and second transistors are scaled in size to produce a pair having substantially equal transconductance values.

3. The circuit of claim 2 wherein said source of tail current is adjusted so that said first and second transistors conduct in a region where their gate to source voltage variations as a function of temperature changes are close to zero.

4. The circuit of claim 1 wherein said first and second transistors form the input stage in a differential operational amplifier that has inverting and noninverting inputs and further comprises:

a high gain inverting amplifier driven from said input stage; and a low impedance output stage driven from said high gain inverting amplifier and operating to produce an output potential related to said reference potential.

5. The circuit of claim 4 wherein said input stage operates into a current mirror that drives said high gain inverting amplifier, one transistor gate comprises said amplifier noninverting input, and the other transistor gate comprises said amplifier inverting input.

6. The circuit of claim 5 wherein said output stage is directly coupled to said inverting input.

7. The circuit of claim 6 wherein the directly coupled connection between said output stage and said inverting input includes an attenuator to increase said output potential relative to said reference potential.

8. The circuit of claim 7 wherein said attenuator is digitally programmable to provide a selected output potential.

* * * * *